(12) United States Patent
Mallikarjunaswamy et al.

(10) Patent No.: US 10,038,062 B2
(45) Date of Patent: Jul. 31, 2018

(54) CIRCUIT CONFIGURATION AND MANUFACTURING PROCESSES FOR VERTICAL TRANSIENT VOLTAGE SUPPRESSOR (TVS) AND EMI FILTER

(71) Applicant: Alpha and Omega Semiconductor Incorporated, Sunnyvale, CA (US)

(72) Inventors: Shekar Mallikarjunaswamy, San Jose, CA (US); Madhur Bobde, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 15/681,391

(22) Filed: Aug. 20, 2017

(65) Prior Publication Data

US 2017/0373158 A1    Dec. 28, 2017

Related U.S. Application Data

(62) Division of application No. 14/554,010, filed on Nov. 25, 2014, now Pat. No. 9,748,346, which is a division of application No. 13/720,042, filed on Dec. 19, 2012, now Pat. No. 8,896,093, which is a division of application No. 12/806,659, filed on Aug. 18, 2010, now Pat. No. 8,338,915, which is a division of application No. 11/600,696, filed on Nov. 16, 2006, now Pat. No. 7,781,826.

(51) Int. Cl.
| | | |
|---|---|---|
| *H01L 29/66* | (2006.01) | |
| *H01L 29/40* | (2006.01) | |
| *H01L 27/02* | (2006.01) | |
| *H01L 29/861* | (2006.01) | |
| *H01L 23/552* | (2006.01) | |
| *H01L 23/522* | (2006.01) | |
| *H01L 29/06* | (2006.01) | |

(52) U.S. Cl.
CPC ........ *H01L 29/407* (2013.01); *H01L 23/5223* (2013.01); *H01L 23/552* (2013.01); *H01L 27/0259* (2013.01); *H01L 27/0266* (2013.01); *H01L 29/861* (2013.01); *H01L 29/8611* (2013.01); *H01L 29/8613* (2013.01); *H01L 29/0649* (2013.01); *H01L 29/402* (2013.01); *H01L 2924/0002* (2013.01)

(58) Field of Classification Search
CPC . H01L 29/407; H01L 23/552; H01L 27/0259; H01L 29/8611; H01L 29/861; H01L 23/5223; H01L 29/8613; H01L 27/0266; H01L 29/0649; H01L 2924/0002; H01L 29/402
USPC ............... 257/330, 331, 121, 329, 328, 335; 438/270, 271, 259, 588
See application file for complete search history.

(56) References Cited

U.S. PATENT DOCUMENTS

| | | | | |
|---|---|---|---|---|
| 5,326,711 A | * | 7/1994 | Malhi | ............... H01L 29/66348 257/E21.384 |
| 2003/0001199 A1 | * | 1/2003 | Shibib | ................. H01L 27/0255 257/330 |
| 2007/0145411 A1 | * | 6/2007 | Chen | .................. H01L 27/0629 257/173 |

\* cited by examiner

*Primary Examiner* — Thinh T Nguyen
(74) *Attorney, Agent, or Firm* — Bo-In Lin

(57) ABSTRACT

A vertical TVS (VTVS) circuit includes a semiconductor substrate for supporting the VTVS device thereon having a heavily doped layer extending to the bottom of substrate. Deep trenches are provided for isolation between multi-channel VTVS. Trench gates are also provided for increasing the capacitance of VTVS with integrated EMI filter.

10 Claims, 20 Drawing Sheets

CIRCUIT CONFIGURATION AND MANUFACTURING PROCESSES FOR VERTICAL TRANSIENT VOLTAGE SUPPRESSOR (TVS) AND EMI FILTER

Under U.S.C. 120, this application is a Divisional application and claims priority to U.S. patent application Ser. No. 14/554,010 filed on Nov. 25, 2014. Patent application Ser. No. 14/554,010 is a Divisional application of a co-pending application Ser. No. 13/720,042 filed on Dec. 19, 2012 by the Applicants of this application issued into U.S. Pat. No. 8,896,093 on Nov. 25, 2014. Application Ser. No. 13/720, 042 is a Divisional application of Ser. No. 12/806,659 filed on Aug. 18, 2010 now issued into U.S. Pat. No. 8,338,915. Application Ser. No. 12/806,659 issued on Dec. 24, 2012 as U.S. Pat. No. 8,338,915 is a Divisional application of application Ser. No. 11/600,696 filed on Nov. 16, 2006 now issued as U.S. Pat. No. 7,781,826 on Aug. 24, 2010. The Disclosures made in the patent application Ser. Nos. 11/600, 696, 12/806,659 and 13/720,042 are hereby incorporated by reference.

BACKGROUND OF THE INVENTION

1. Field of the Invention

The invention relates generally to a circuit configuration and method of manufacture of a transient voltage suppressor (TVS). More particularly, this invention relates to an improved circuit configuration and method of manufacture of a vertical transient voltage suppressor (VTVS) with EMI filter.

2. Description of the Relevant Art

The transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to serve the protection functions to circumvent the damages that are likely to occur to the integrated circuits when such over voltage conditions occur. As increasing number of devices are implemented with the integrated circuits that are vulnerable to over voltage damages, demands for TVS protection are also increased. Exemplary applications of TVS can be found in the USB power and data line protection, Digital video interface, high speed Ethernet, Notebook computers, monitors and flat panel displays.

FIG. 1A-1 shows a typical commercially available multi-channel TVS array 10. There are two sets of steering diodes, i.e., diodes 15-H and 15-L and 20-H and 20-L respectively for each of the two input/output (I/Os) terminals I/O-1 and I/O-2. Furthermore, there is a Zener diode, i.e., diode 30, with a larger size to function as an avalanche diode from the high voltage terminal, i.e., terminal Vcc, to the ground voltage terminal, i.e., terminal Gnd. At a time when a positive voltage strikes on one of the I/O pads, the high side diodes 15-H and 20-H provide a forward bias and are clamped by the large Vcc-Gnd diodes, e.g., the Zener diode 30. The steering diodes 15-H and 15-L and 20-H and 20-L are designed with a small size to reduce the I/O capacitance and thereby reducing the insertion loss in high-speed lines such as fast Ethernet applications. FIG. 1A-2 shows the reverse current IR versus reverse blocking voltage characteristics of the Zener diode between the Vcc and the ground voltage of the TVS 10 shown in FIG. 1A-1. The reverse current IR as that shown in the diagram of FIG. 1A-2 represents a reverse current conducted through the Zener diode, i.e., between Vcc and GND. Here it is assumed that the reverse BV of each steering diode is higher than the reverse BV of the Zener diode. But note that at high currents when the Vcc to Gnd pad voltage is equal or higher than the summation of the reverse BV of the steering diodes then the current would also flow through all the two series steering diode paths. Since the Zener diode has higher resistance per unit area compared with BJT or SCR and BJT this is actually a disadvantage at higher currents because the steering diodes also have to be rugged in reverse conduction. In the case of the SCR+BJT the Zener clamp voltage is lower at higher currents and hence the steering diodes paths will not conduct. The breakdown voltage of the Vcc-Gnd diode 30 and the steering diodes 15 and 20 should be greater than the operating voltage (Vrwm) so that these diodes only turn-on during the voltage transients. The problem with the Vcc-Gnd clamp diodes is that typically these diodes are very resistive in reverse blocking mode and require large area to reduce resistance. As shown in FIG. 1A-2, the high resistance leads to the increase of BV at high current. This is not desirable as high BV not only causes the break down of steering diodes as described above but also causes damage to the circuit the TVS device intends to protect. The requirement to have large diode size thus limits further miniaturization of a device when such TVS circuit is implemented.

For the purpose of reducing the size and surface areas occupied by the transient voltage suppressor (TVS) circuit, vertical TVS diodes are implemented as shown in FIG. 1B-1. The TVS is implemented with standard P substrate to N+ Zener avalanche diode with the cathode terminal formed on the top surface of a P-substrate doped with a N+ region below the cathode electrode. A metal layer is formed on the bottom of the substrate to function as the anode electrode. The P substrate usually has a resistivity of about 10-20 ohms-cm thus causes a high resistance of the diode. FIG. 1B-2 shows an equivalent circuit of a two channel vertical TVS diodes. The TVS diodes can also be integrated with an EMI filter as that shown in FIGS. 1C-1 and 1C-2. The vertical integrated configuration is similar to that of the vertical TVS diodes with an additional resistor interconnected between two vertical TVS diodes. Such vertical diode and EMI filter configurations as shown in FIGS. 1B-1 to 1C-2 suffer the disadvantage that there is great junction capacitance and has a poor clamping performance due to the high diode series resistance caused by the high resistivity of substrate.

Therefore, a need still exists in the fields of circuit design and device manufactures for providing a new and improved circuit configuration and manufacturing method to resolve the above-discussed difficulties. Specifically, a need still exists to provide new and improved TVS circuits that can provide low cost high density TVS and EMI filters for portable electronic devices.

SUMMARY OF THE PRESENT INVENTION

It is therefore an aspect of the present invention to provide an improved vertical TVS and EMI filter circuit by applying DMOS technology implementing the mainstream DMOS processes to produce low-cost TVS and EMI filter circuits that has small silicon die footprint such that the above discussed limitations and difficulties can be overcome.

Moreover, it is another aspect of the present invention to provide an improved device design and manufacturing method to provide an improved TVS and EMI filter circuit by using the mainstream vertical trench DMOS technology wherein the trench gate is implemented to as part of the TVS structure functioning as channel isolation and filter capacitor.

Another aspect of this invention is to provide an improved vertical TVS and EMI filter circuit by applying DMOS technology implementing the mainstream trench DMOS processes wherein the vertical structures for the TVS and EMI filter structures achieve small silicon die footprint and increase the integrated circuit cell density that further reduces the production costs.

Briefly in a preferred embodiment this invention discloses a transient voltage suppressing (TVS) integrated with an EMI filter for suppressing a transient voltage that includes a first and a second VTVS wherein each of the VTVS comprising a cathode contact doped region of a first conductivity type disposed in a well, i.e., a body region, of a second conductivity type encompassed in an epitaxialtaxial layer of the first conductivity type supported on a semiconductor substrate of the first conductivity type contacting a anode disposed on a bottom surface of the semiconductor substrate with a cathode disposed on a top surface of the semiconductor device contacting the cathode contact doped region thus forming a first and a second vertical TVS. The VTVS integrated with the EMI filter further includes an insulated conductive region electrically connecting the cathode of the first and second VTVS thus functioning together with the first and second VTVS as an EMI filter. In another embodiment, the conductive region is a polysilicon layer disposed on top of the semiconductor substrate for electrically connecting the cathode of the first and second VTVS. In another embodiment, the semiconductor substrate is a N-type substrate and the well of the first and second VTVS are a P-well. In another embodiment, the semiconductor substrate is a P-type substrate and the well of the first and second VTVS are a N-well. In another embodiment, each of the first and second VTVS further includes a doped region of the second conductivity type disposed underneath the cathode contact doped region for adjusting a breakdown voltage of the diode.

In another preferred embodiment, the present invention further discloses an electronic device formed as an integrated circuit (IC) wherein the electronic device further includes a transient voltage-suppressing (TVS) device. The TVS device includes a semiconductor substrate for supporting the VTVS device thereon having a front side functioning as an anode and a backside functioning as a cathode of the VTVS. The VTVS device further includes an inherent diode and a parasitic transistor configured as a trench DMOS wherein a source region and a body region functioning as the inherent diode and the source region, the body region and an epitaxialtaxial layer functioning as the parasitic transistor with a trench gate functioning as an isolation trench. The DMOS further having a trench gate runner shorted to a drain functioning as the cathode disposed on the backside. In a preferred embodiment, the semiconductor substrate further comprising a N-type substrate supporting N-epitaxialtaxial layer with the inherent diode formed between a N-source and P-body region and a NPN transistor formed between the N-source, the P-body and the N-epitaxialtaxial layer. In another embodiment, the trench gate runner is disposed on an edge of the semiconductor substrate have a width greater than the isolation trench for shorting the trench gate runner to the cathode through the epitaxialtaxial layer. In another embodiment, the body region having a dopant concentration corresponding to a MOSFET gate threshold voltage of approximately six volts and a gate oxide layer for the trench gate is provide to sustain a breakdown voltage of approximately fifteen volts whereby the VTVS is turned on when a voltage exceeding six volts is applied thereon and the parasitic transistor is provided to transmit a transient current for maintaining a voltage below a clamping voltage.

The present invention further discloses a method for manufacturing an electronic device with an integrated transient voltage suppressing (TVS) circuit. The method includes a step of applying a standard DMOS manufacturing process to manufacture a vertical DMOS device with an inherent PN junction diode and a parasitic NPN or PNP transistor to function as a vertical TVS.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 1B-1 is a cross sectional view of a vertical TVS diode and FIG. 1B-2 is an equivalent circuit diagram of a convention vertical TVS diode.

FIG. 1C-1 is a cross sectional view of a vertical TVS diode integrated with an EMI filter and FIG. 1C-2 is an equivalent circuit diagram of the convention vertical TVS diode integrated with the EMI filter.

DETAILED DESCRIPTION OF THE METHOD

Figure 2A:
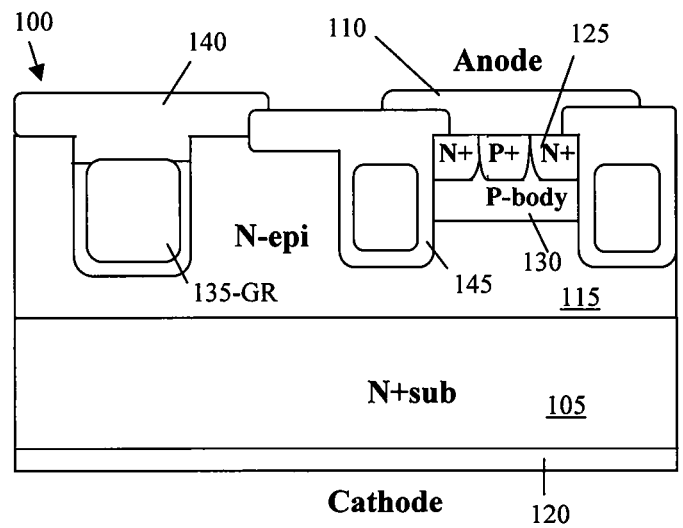
FIGS. 2A and 2B are a cross sectional view and an equivalent circuit respectively of a vertical TVS configured as a trench DMOS manufactured by vertical trench DMOS technology.
Figure 2B:
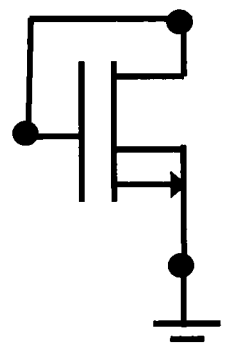

Refer to FIGS. 2A and 2B for a side cross sectional view and a circuit diagram of a vertical transient voltage suppressor (VTVS) 100 fabricated by using the standard DMOS process. The VTVS 100 is formed on a heavily doped semiconductor substrate 105 that includes a front side functioning as an anode terminal 110 and a backside functioning as a cathode terminal 120 for the vertical TVS that includes an inherent diode and NPN transistor. As the product is fabricated by applying standard trench DMOS process, the cross section in FIG. 2A shows a trench NMOS structure with source regions 125 formed over a body region 130 on top of a N epitaxialtaxial layer 115 over the 105 N+ substrate functioning as a drain. The insulated trench gates 135 interconnected with a gate runner 135-GR at the edge area through other trench gates in a third dimension. The difference of this VTVS device from a regular trench DMOS is that the gate runner 135-GR is shorted to the drain 105 by a gate metal 140 in the gate trench contact (or gate pad) area connecting to the N epitaxial layer 115 as shown in FIG. 2A. This is achieved by etching a gate contact opening 140 with a width larger than the gate runner trench 135-GR during the DMOS contact opening process without the use of an extra mask. The equivalent circuit in FIG. 2B thus shows the gate shorted to the drain. To make a VTVS for 5V devices, the dopant concentration of the P-body 130 may be increased by multiple implantations to a level corresponding to a MOSFET gate threshold voltage of about 6V and the thickness of the gate oxide 145 is increased to sustain a breakdown as high as 15V. Therefore, the VTVS will not be turned on when a normal 5V operating voltage is applied. However in the case a transient high voltage exceeding 5V occurs, that voltage is applied to the gate and will turn on the MOS. The parasitic NPN will also be turned on therefore large current will flow through the device without much resistance, providing an improved clamping over a diode. FIG. 2A also shows the DMOS body region 130 is shorted to the source 125 as in a regular DMOS device.

Figure 3A:
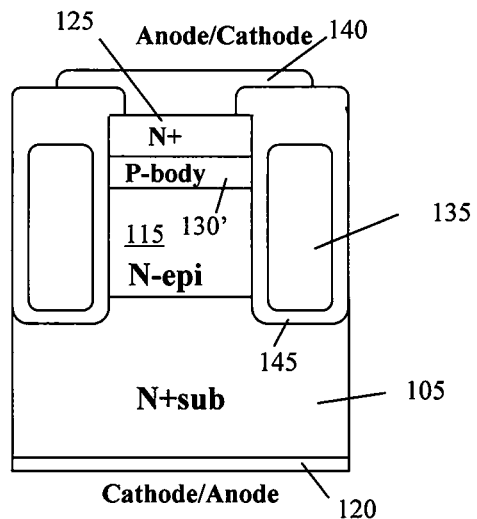
FIGS. 3A to 3D are cross sectional views and equivalent circuits respectively of two other embodiments of vertical TVS manufactured by vertical trench DMOS technology.
Figure 3B:
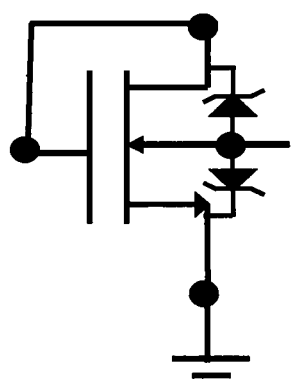
Figure 3C:
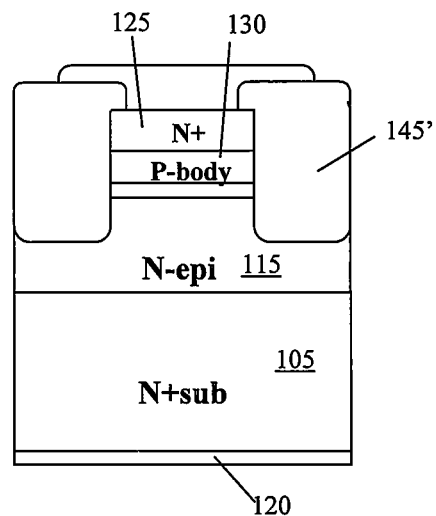
Figure 3D:
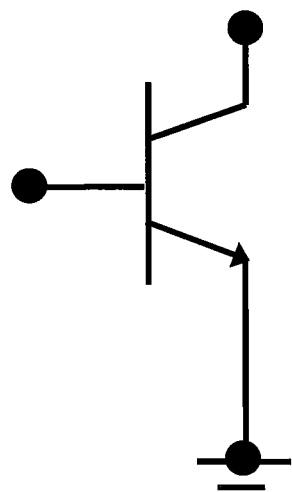

FIG. 3A is a cross sectional view of an alternate embodiment with similar device structure as that shown in FIG. 2A with the exception the body region 130' is floating. As shown in the equivalent circuit FIG. 3B, the gate 135 is tied to the drain 105 and the device functions as a MOS+NPN. The gate 135 could also be tied to the source 125 and in that case the MOS transistor will never be turned on and the device functions as a NPN. The depth of the gate 135 can also extend through the N-epitaxial layer 115 into a depth of N+ substrate 105 to improve isolation between channels and between Input and Output terminals. Furthermore, the trench gate 135 can be filled with oxide 145' or other dielectric material instead of conductive material as in FIG. 3C. The N+region 125, P-body region 130 and N-epitaxial 115 form an open base NPN as in FIG. 3D. The body 130 to N+ region 125 or N-epitaxial junction 115 is adjusted to have a breakdown voltage of 6V by changing the dopant concentration of the P-body region 130 so that when a higher voltage transient voltage strike the junction, a breakdown occurs and the breakdown triggers the NPN to turn on thus protecting the other circuits. In addition to the device structure shown in FIGS. 2 and 3, a P-channel DMOS and a PNP of VTVS can be made in a similar way by simply changing the polarities of semiconductor.

Figure 4:
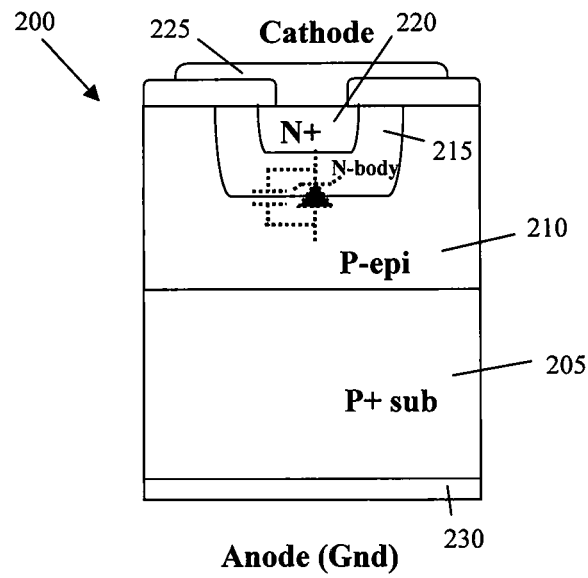
FIG. 4 is a cross sectional view of a TVS circuit configured as a vertical diode manufactured by using a DMOS technology.

Refer to FIG. 4 for an improved diode for VTVS application. The diode 200 is based on a heavily doped P+ substrate 205 to reduce resistance. The heavily doped P+ substrate as used in DMOS provides a resistivity of only a few milliohm cm compare to 10-20 ohms cm resistivity of P substrate used in the prior art diode manufacture by standard IC process. Alternatively, a lightly doped substrate with a heavily doped bottom layer to reduce resistivity may be used. A N-body 215 is formed by implantation into a P-epitaxial layer 210 with Arsenic or Phosphor ions whereas by controlling the dopant concentration the breakdown between the N-body 215 and P-epitaxial 210 can be adjusted to about 6V or any voltage as required. The P-epitaxial layer 210 has a thickness of only a few microns to minimize the resistance. Furthermore an N+ region 220 is formed on top of the N-body region 215 to improve ohmic contact to the cathode electrode 225 with the anode terminal 230 formed on the bottom of the substrate 205.

Figure 5A:
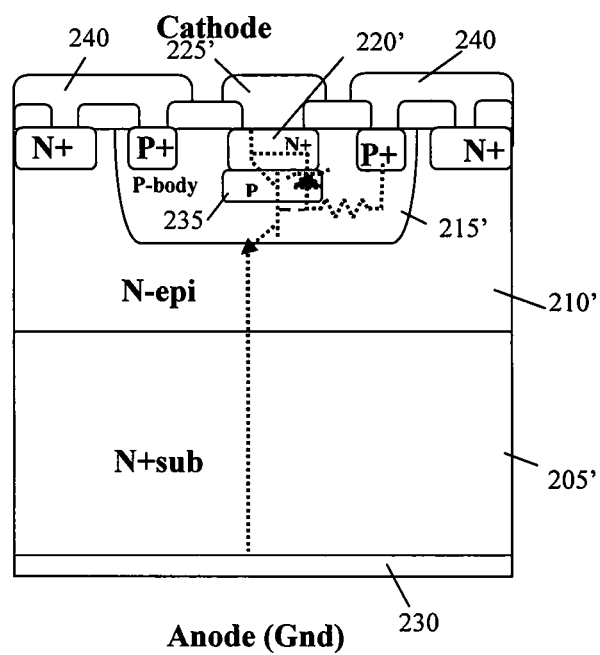
FIGS. 5A-5E are cross sectional views of embodiments of vertical TVS configured as an bipolar transistor manufactured by using a DMOS technology.
Figure 5B:
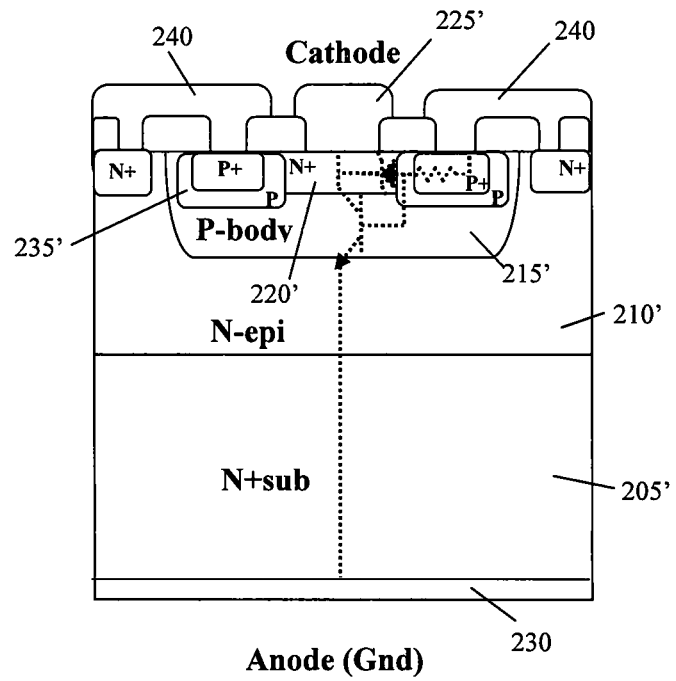
Figure 5C:
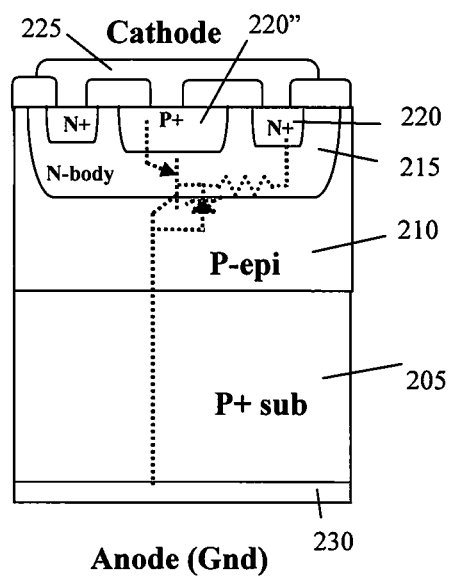

FIGS. 5A to 5C are bipolar transistors for VTVS application. Shown as NPN in FIG. 5A a N+ region 220' is implanted into a P-well formed top of a N-epitaxial layer 210' over a N+substrate 205' to form the cathode region connected to cathode electrode 225'. An optional P region 235 may be disposed under the N+cathode region 220' for adjusting the breakdown by varying the P dopant concentration. The P-well 215' is short to the anode 230 through a contact metal 240 and the N-epitaxial layer 210'. When a transient high voltage exceeding the designated working voltage of device strikes the junction between N+cathode region 220' and the P region 235 underneath will breakdown causing the electrons to flow through the short-contact metal 240 to the N-epitaxial 210 to reach the anode 230. When the current increase the NPN formed between regions 220', 235, 215' and 210' will be turn on to conduct even higher current with lower resistance therefore improves the clamping performance. In FIG. 5B the breakdown adjustment P region 235' is displaced lateral to the N+cathode region 220'. This provides an advantage that the spacing gaps between contacts of metal electrodes 240 and 225' to N+/P region junction where breakdown occurs may be flexibly adjusted to avoid overheating.

FIG. 5C is another improved VTVS based on PNP bipolar transistor. Compare to diode 200 in FIG. 4, the device in FIG. 5C further includes a P+implant region 220" within the N-body 215 connecting to cathode. The P+ region 220", N-well 215 and P-epitaxial 210 or P+ substrate 205 configured as a PNP transistor that is provided for triggering on by the junction breakdown between the N-body 215 and P-epitaxial 210. The clamping of the VTVS device is therefore improved.

Figure 5D:
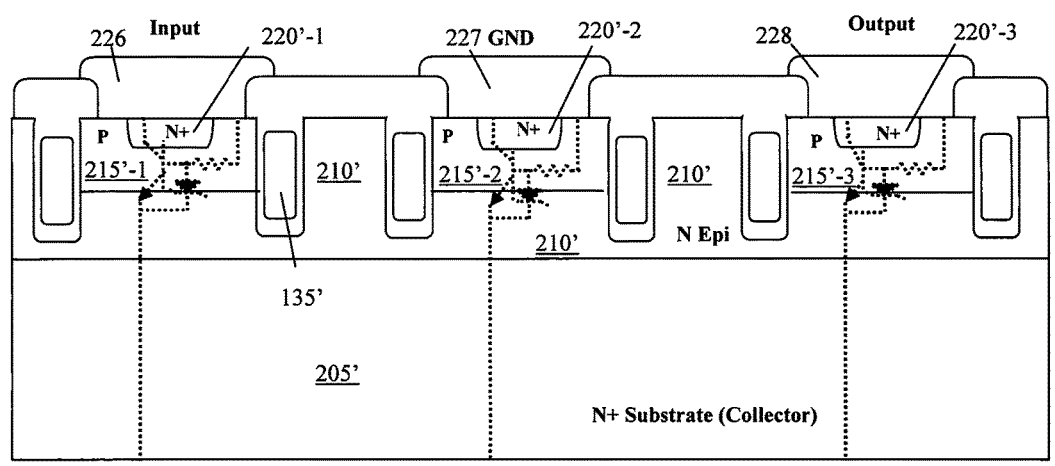
Figure 5E:
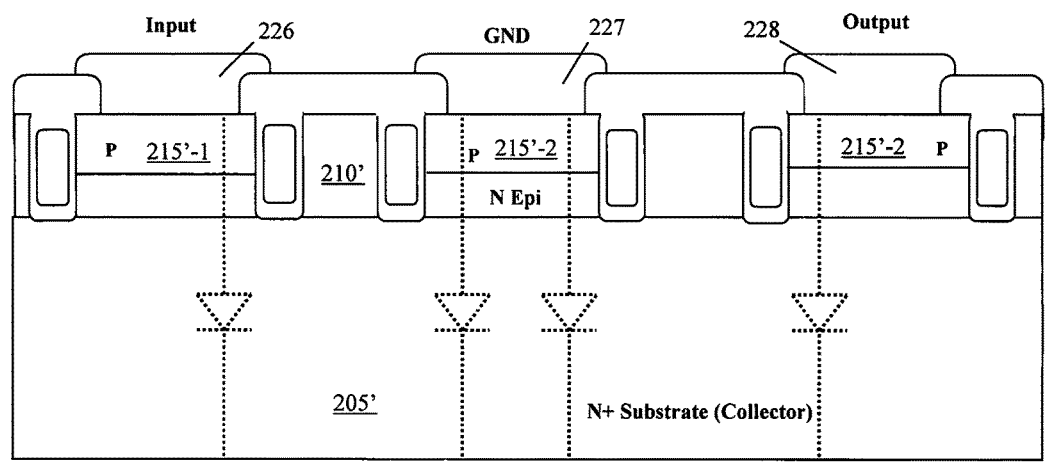

FIG. 5D is a cross sectional view of an alternate embodiment with similar operation principle configured as a symmetric TVS. The P-well 215's are shorted to N+ 220's and directly connected to electrode terminals 226, 227 and 228 designated as Input, Ground (GND) and output respectively while the bottom of semiconductor substrate is floating. The Input, Output and Ground channels are further isolated by a plurality of gate trenches 135'. During a high voltage transient the junction between P-well 215' and N-epitaxial 210' will breakdown and trigger turning on the NPN formed by N+ 220', P-well 215' and N-epitaxial 210'. A positive high voltage transient striking at the Input or Output terminal will trigger the Ground channel TVS while a negative high voltage transient striking at the Input or Output terminal will trigger the Input or Output channel TVS. As all the channels are manufacturing at the same time the positive and negative transient voltage required to trigger TVS channels are substantially with same amplitude the TVS device therefore is symmetric. FIG. 5E is a cross sectional view of an alternate embodiment with similar device structure as that shown in FIG. 5D with the exception the N+ 220' is eliminated therefore the clamping function is provided by the junction diode formed between P-well 215' and N-epitaxial 210'. The symmetric operation remains.

Figure 6:
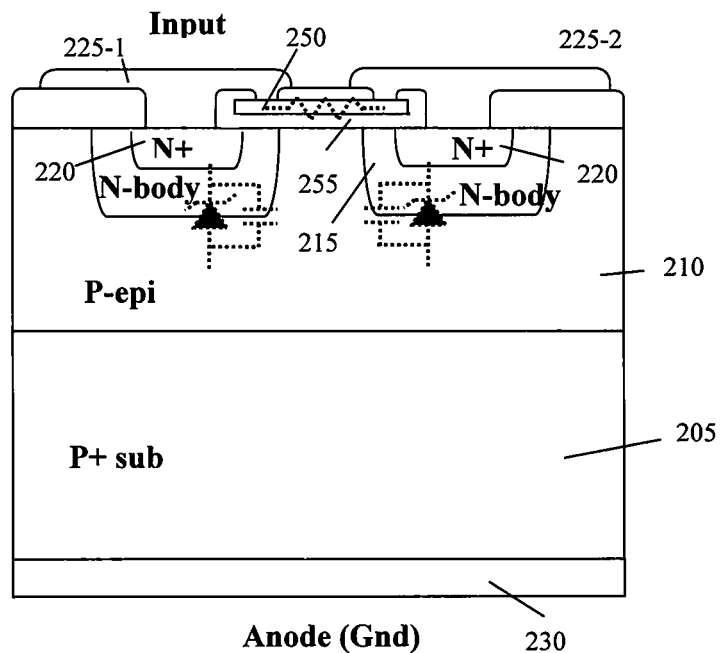
FIG. 6 is a cross sectional view of a vertical TVS integrated with EMI filter configured as diodes connected by a resistor element manufactured by using a DMOS technology.

FIG. 6 is a cross sectional view of a multi-channel TVS and an EMI filter wherein the device structure is implemented based on the TVS device structure as that shown in FIG. 4. A first and a second vertical TVS (VTVS) are formed as a first diode and second diode based on a P+ substrate 205 to reduce resistance. Each of these first and second diodes includes a N-body 215 formed by implantation into a P-epitaxial layer 210 with Arsenic or Phosphor ions. The breakdown between the N-body 215 and P-epitaxial 210 of these diodes are adjusted to about 6V or any voltage as required by controlling the dopant concentration of the P-epitaxial layer 210 that has a thickness of only few microns thus reducing the resistance. For each of these diodes, a N+ region 220 is formed on top of the N-body region 215 to improve ohmic contact to a first and second cathode electrodes 225-1 and 225-2 with the anode terminal 230 formed on the bottom of the substrate 205. The device further functions as an EMI filter with the cathode electrode 225-1 functions as an input terminal and the second cathode electrode 225-2 functions as an output terminal with a polysilicon layer 250 formed onto an insulation layer 255 to electrically connect the first and second electrodes 225- to 225-2. The polysilicon layer 250 functions as a resistor interconnected between the first and second cathode electrodes 225-1 and 225-2 function as an input and output terminal respectively.

Figure 7A:
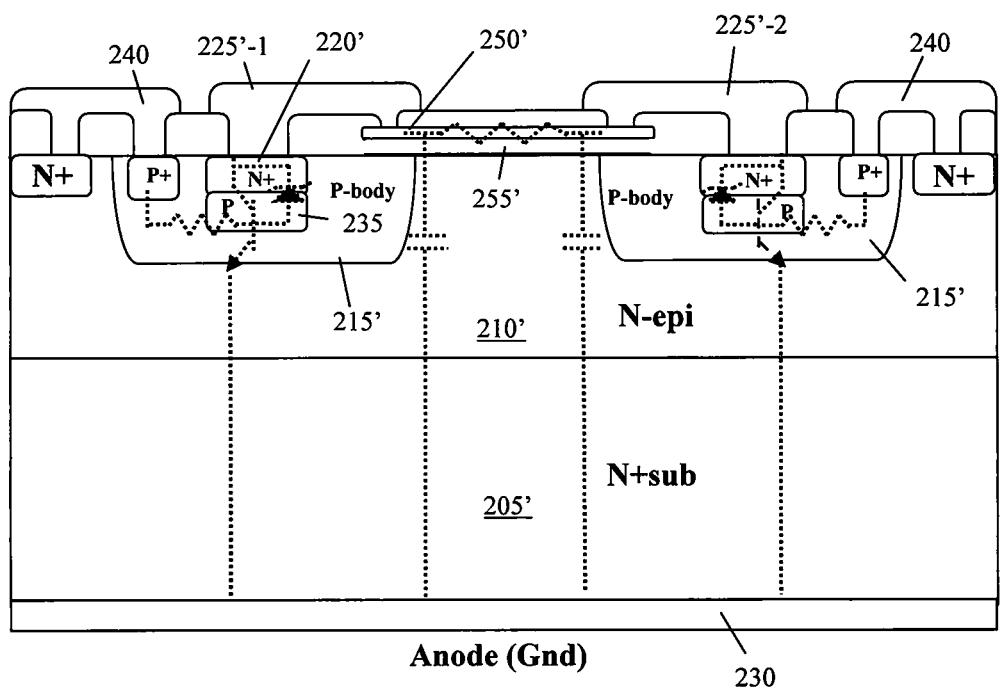
FIG. 7A-7B are cross sectional views of vertical TVS integrated with EMI filter configured as bipolar transistors connected by a resistor element manufactured by using a DMOS technology.
Figure 7B:
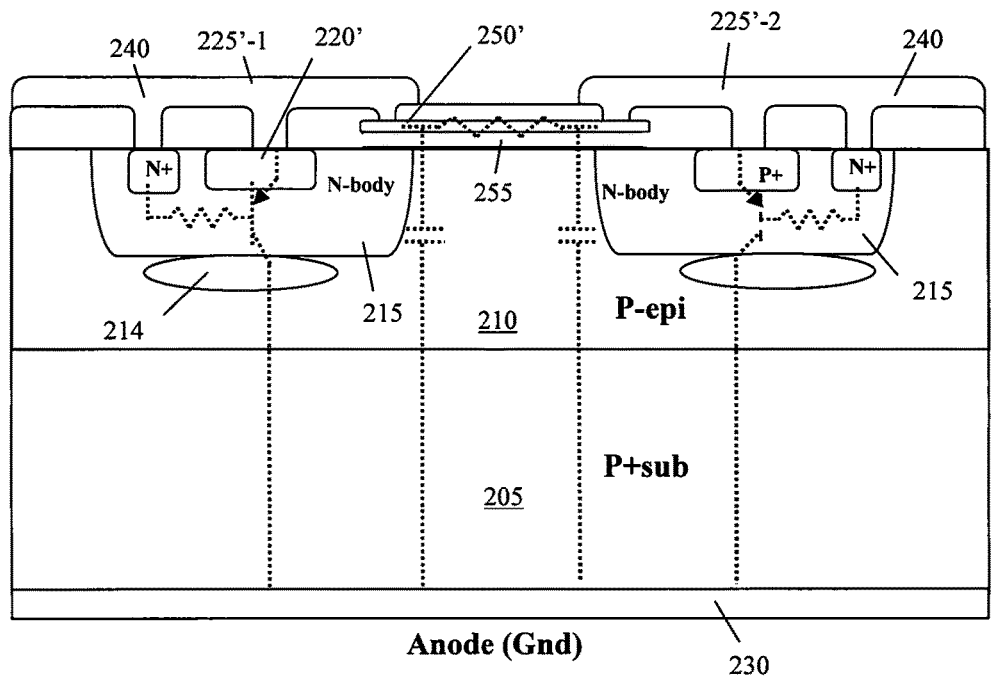

FIG. 7A is a cross sectional view for showing a device structure of a multi-channel TVS integrated with an EMI filter that includes a first and second vertical TVS based on a device structure shown in FIG. 5A. The cathode electrodes 225'-1 and 225'-2 of the first and second VTVS are interconnected by a polysilicon layer 250' padded by a insulation layer 255'. The polysilicon layer 250' function as a resistor between an input and output terminals of the EMI filter provided by the first and second cathodes 225'-1 and 225'-2 respectively. FIG. 7B is a PNP complementary structures of FIG. 7A showing a device structure of a TVS integrated with an EMI filter that includes a first and second vertical TVS based on a device structure shown in FIG. 5C. An optional P implant 214 may be formed under N-body 215 for the purpose of breakdown adjustment.

Figure 8:
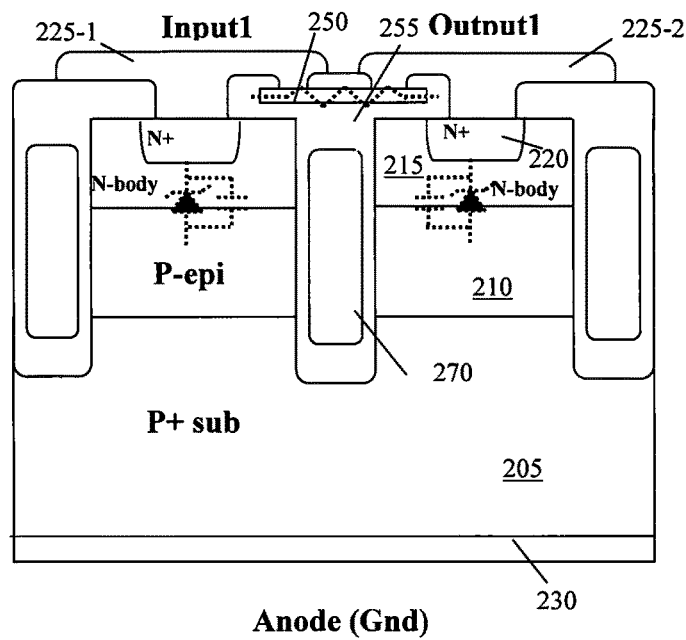
FIG. 8 is a cross sectional view of a vertical TVS integrated with EMI filter configured as diodes isolated by trenches and connected by a resistor element manufactured by using a DMOS technology.
Figure 9A:
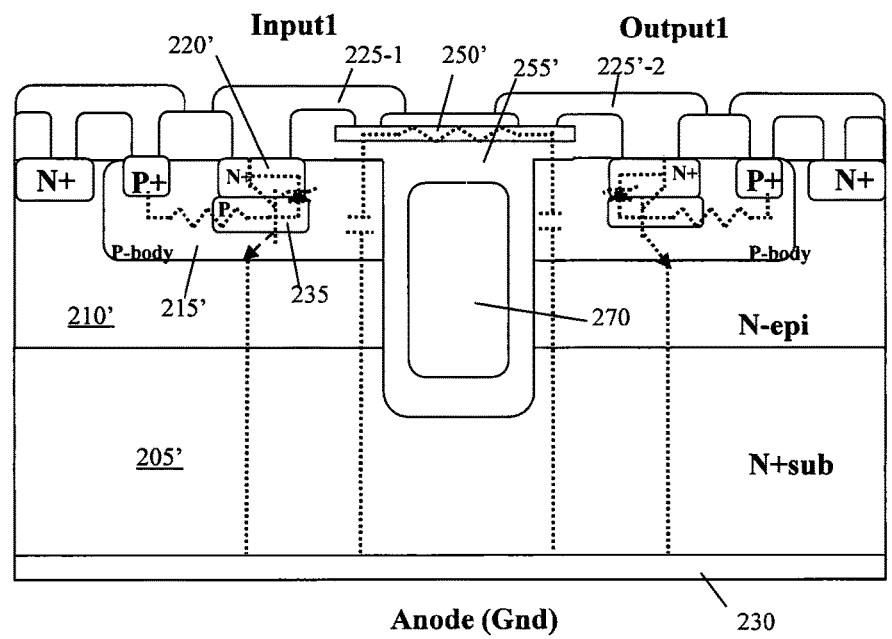
FIG. 9A-9D are cross sectional views of vertical TVS integrated with EMI filter configured as bipolar transistors isolated by trenches and connected by a resistor element manufactured by using a DMOS technology.
Figure 9B:
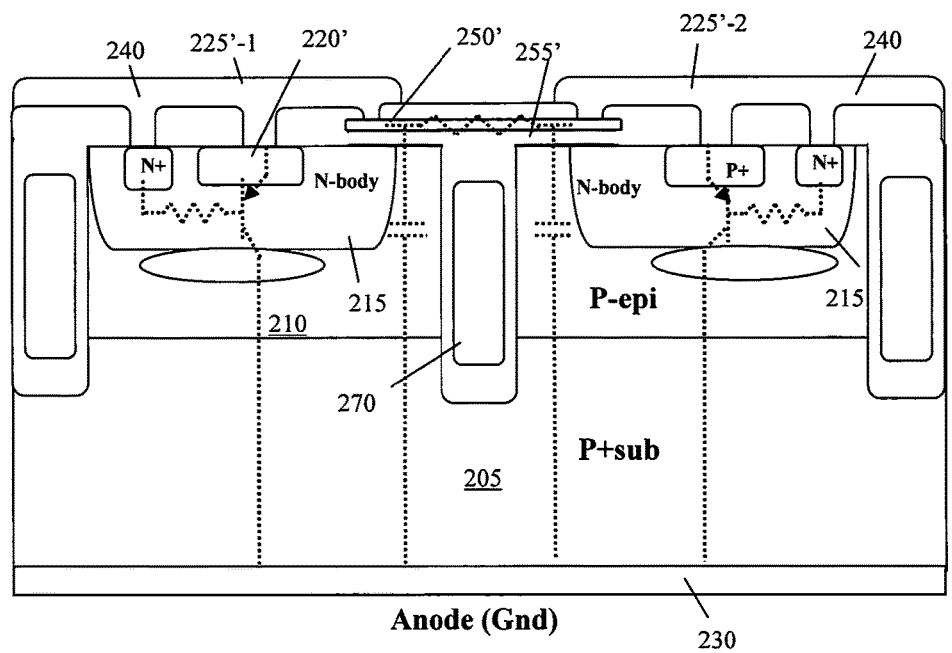
Figure 9C:
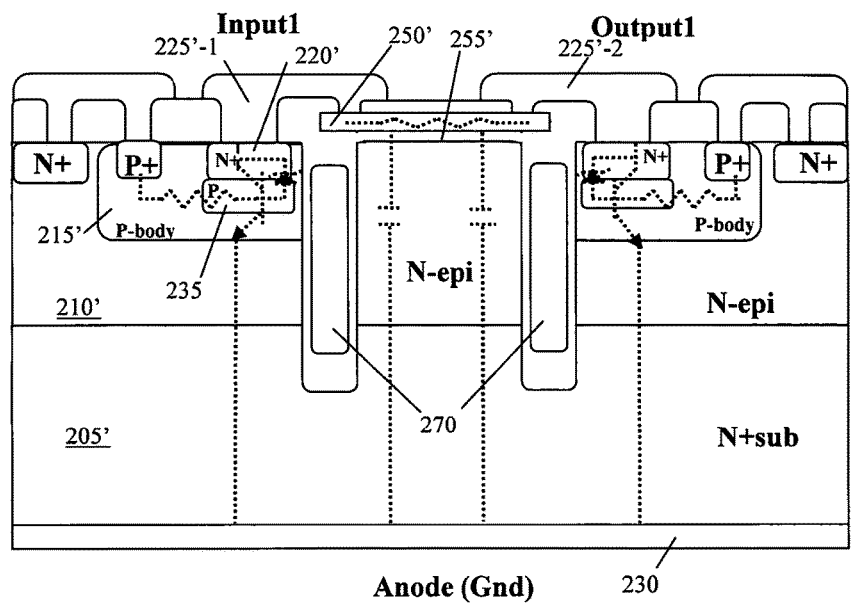
Figure 9D:
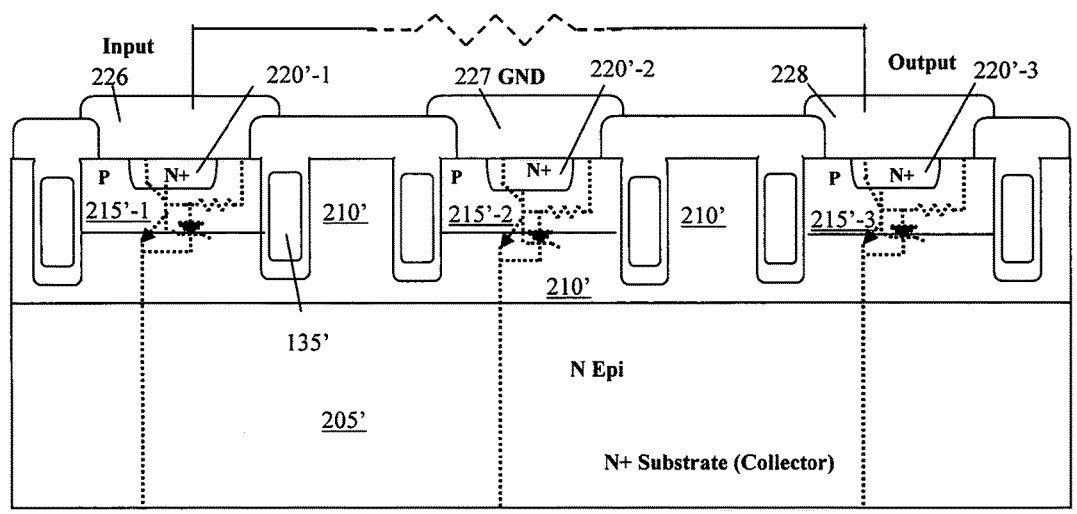

FIG. 8 shows a multi-channel TVS integrated with an EMI filter that has a device structure similar to the device structure of the TVS and EMI filter shown in FIG. 6 except that there are isolation trenches 270 formed underneath the polysilicon layer 250 padded with the insulation layer 255. FIG. 9A shows another multi-channel TVS integrated with an EMI filter that has a device structure similar to the device structure of the TVS and EMI filter shown in FIG. 7A except that there are isolation trenches 270 formed underneath the polysilicon layer 250' padded with the insulation layer 255'. FIG. 9B shows another multi-channel TVS integrated with an EMI filter that has a device structure similar to the device structure of the TVS and EMI filter shown in FIG. 7B except that there are isolation trenches 270 formed underneath the polysilicon layer 250' padded with the insulation layer 255'. More trenches may be used to improve input output isolation as shown in FIG. 9C. Furthermore FIG. 9D is a multi-channel symmetric TVS integrated with EMI filter constructed on the symmetric TVS device structures in FIG. 5D and by connecting input terminal 226 and out put terminal 228 with a resistor or an inductor. PNP complementary structures may be manufactured by switching the doping polarity.

Figures 1, 1A:
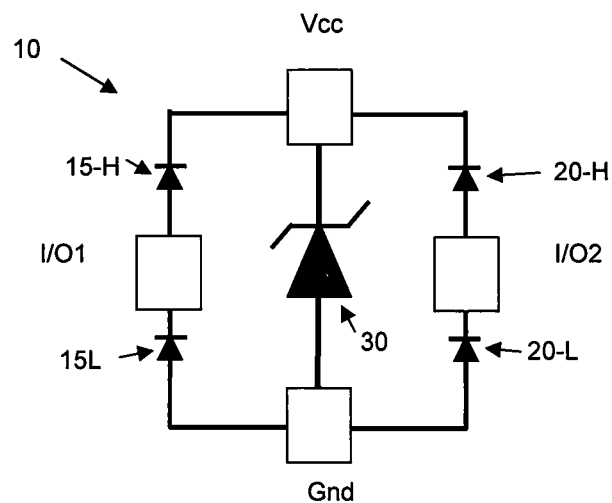
FIG. 1A-1 is a circuit diagram for showing a conventional TVS device and FIG. 1A-2 is an I-V diagram, i.e., a current versus voltage diagram, for illustrating the reverse characteristics of the TVS device.
Figures 1, 1A, 2:
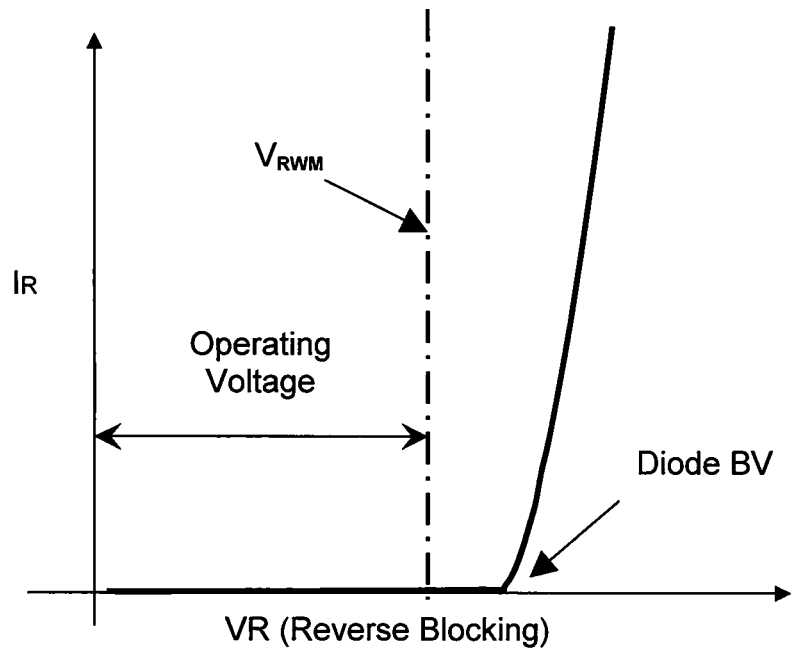
Figures 1, 1B:
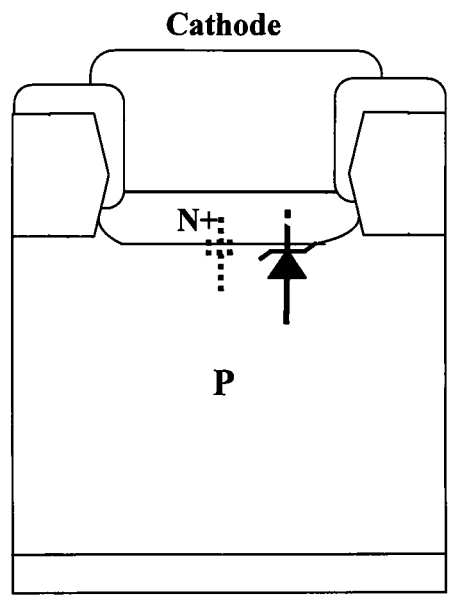
Figures 1, 1B, 2:
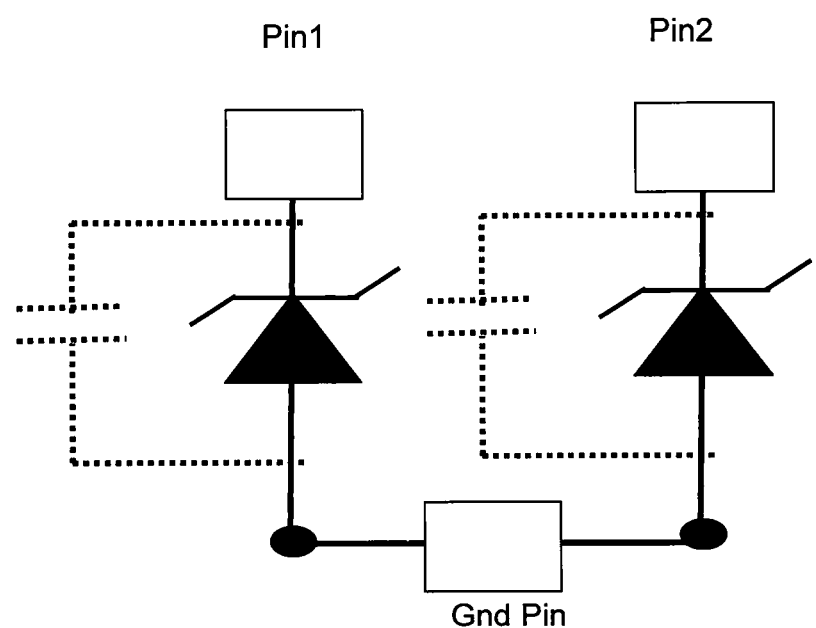
Figures 1, 1C:
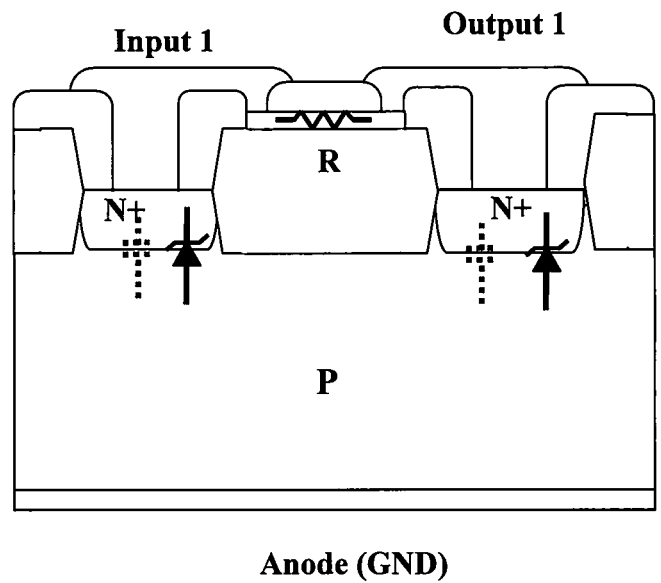
Figures 1, 1C, 2:
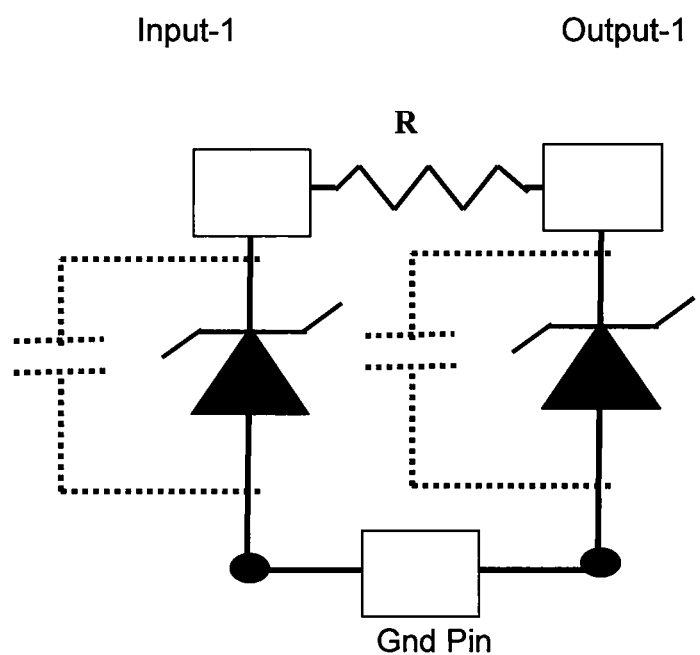
Figure 10A:
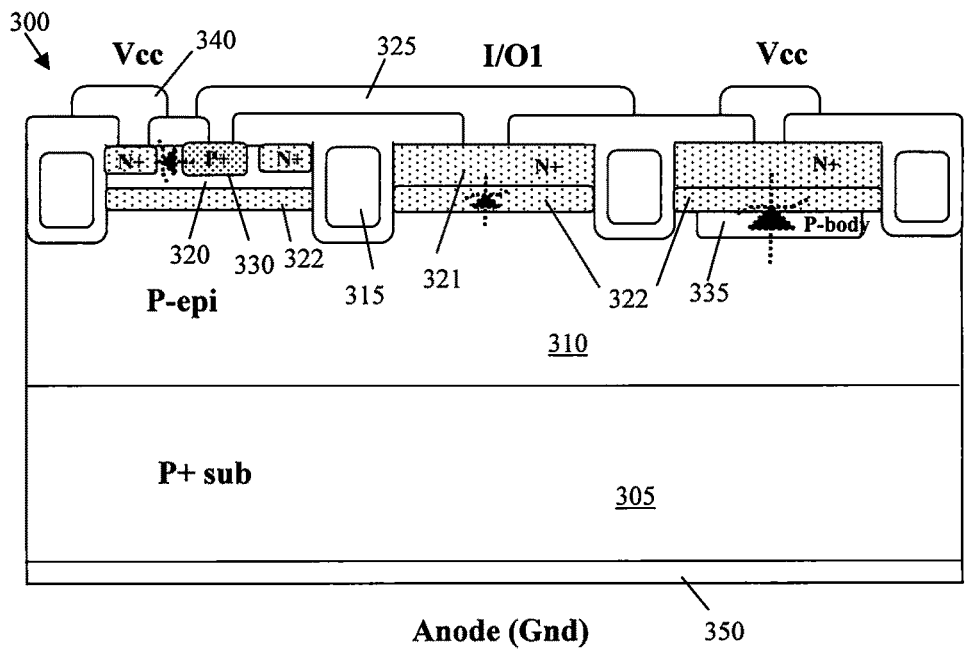
FIG. 10A-B are cross sectional views of vertical TVS configured as steering diodes and TVS with trenches isolations between the diodes manufactured by using a DMOS technology.
Figure 10B:
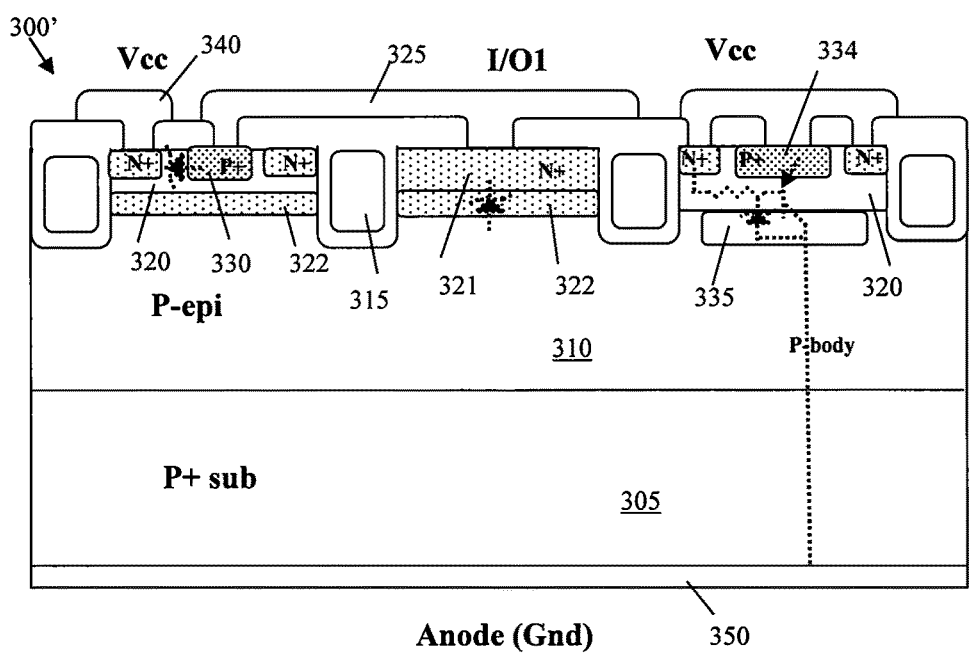

FIGS. 10A and 10B are cross sectional views for showing multi-channel TVS that have a circuit similar to that shown in FIG. 1A-1 but implemented with a new device structure. The TVS 300 in FIG. 10A is formed on a P+ substrate 305 supporting a P-type epitaxialtaxial layer 310. A plurality of N-body regions 320 are formed between isolation trenches 315. A P+ohmic contact dopant region 330 is formed in the N-body region 320 to contact the Input-output (I/O) port 325. An optional N+buried layer 322 may be formed below the P+junction by high energy N+implant to reduce the PNP gain. A P-body region 335 is disposed underneath the N-body region 320 and the optional N+buried layer 322 to function as a Zener diode. The P+ohmic contact dopant region 330 and the N-body region 320 provide the function as an upper diode connected between the IO terminal 325 and the Vcc terminal 340. The diode formed between the epitaxialtaxial layer 310 and the N-body region 320 is connected between the IO terminal 325 and the anode terminal 350 at a ground potential. Meanwhile the Zener diode is connected between the Vcc 340 and ground voltage of the anode terminal 350 in parallel to the upper and lower diodes connected with the IO terminal 325 disposed at the mid-point between the upper and lower diodes. Each of the diodes are isolated by the isolation trenches 315. FIG. 10B is a further improved structure using PNP to replace Zener diode. A mask is used to block the N-well 320 where P+ region 334 is located during optional implantation of N+ region 322. The PNP transistor formed by P+ region 334, N-well 320 and P body region 335 can be triggered on by the junction breakdown between N-well 320 and P body 335.

Figure 11:
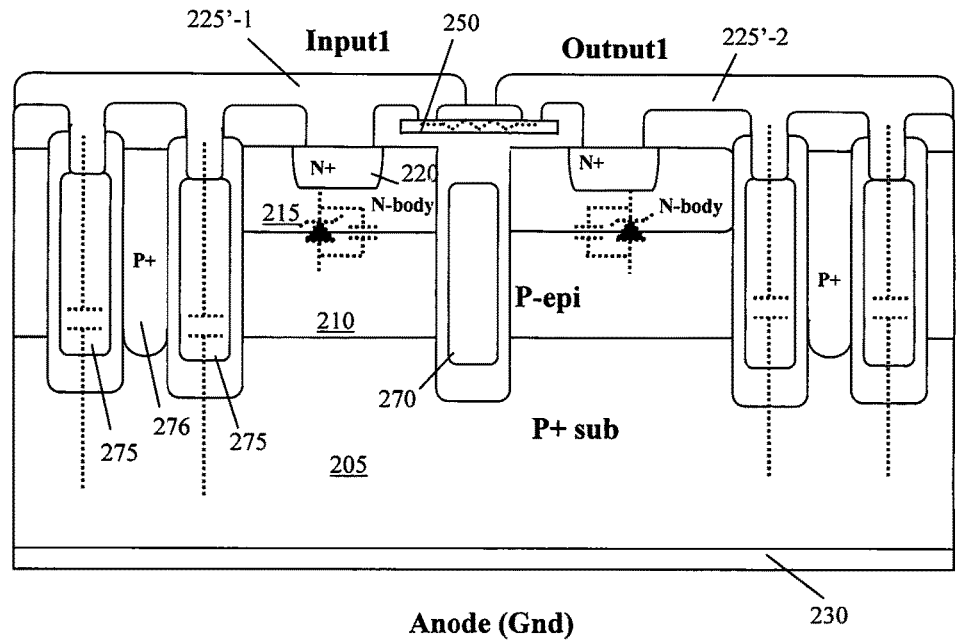
FIGS. 11, 12A and 12B are cross sectional view of two vertical TVS integrated with EMI filter configured with trenches isolations between input and output channels wherein the poly-filled trenches further function as poly capacitors manufactured by using a DMOS technology.
Figure 12A:
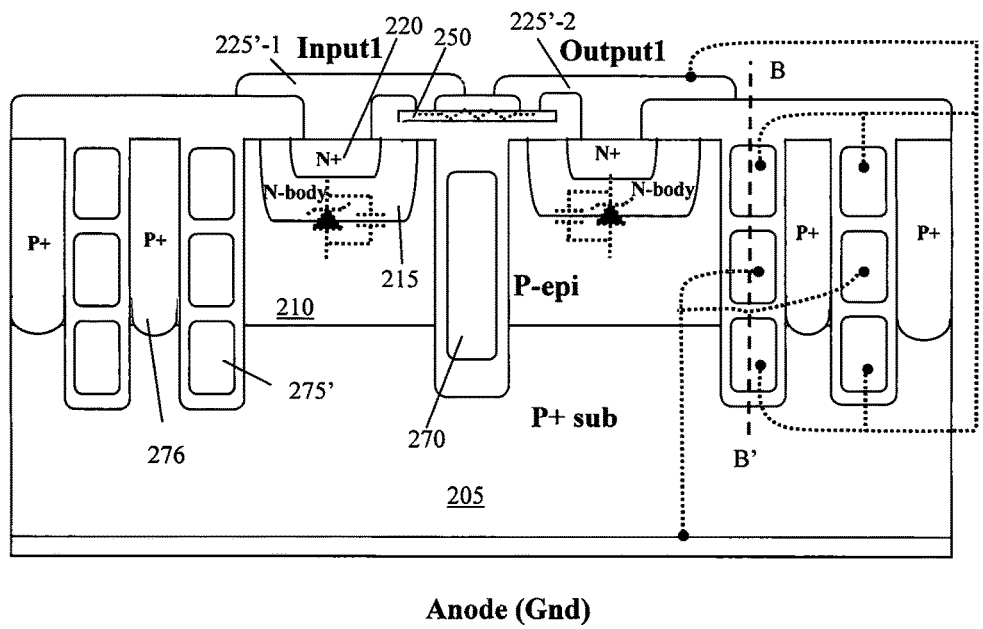
Figure 12B:
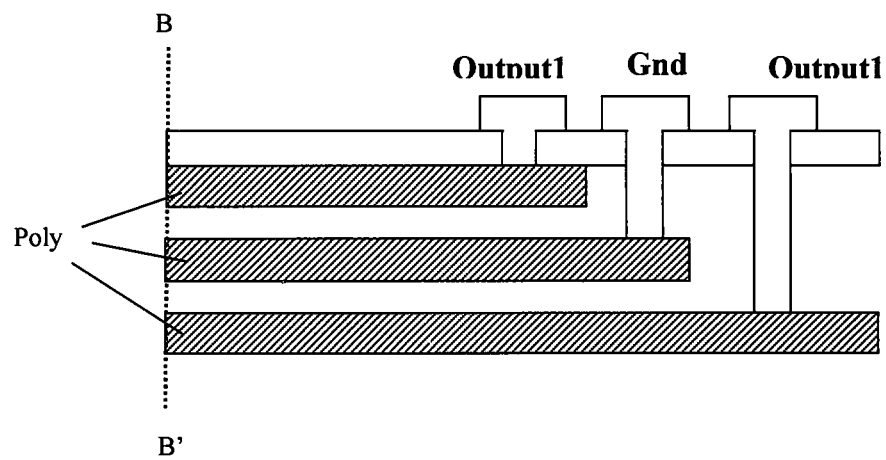

FIG. 11 is a cross sectional view of a multi-channel TVS integrated with an EMI filter interconnected between the input and output terminals 225'-1 and 225'-2 as that shown in FIG. 8 with additional trenches 275 to increase capacitance with parasitic capacitor formed between the trenched gates 275 and the epitaxial layer 210'. The capacitors are connected in parallel as shown in FIG. 11. The cut off frequency of EMI filter can be adjusted by varying the capacitance. Optional p-diffusion regions 276 may be implanted enclosing the trench capacitors to reduce equivalent series resistance (ESR) of capacitor by making good low resistance contact to substrate. FIG. 12A has a similar device structure with split trench gates 275' to further increase the capacitance. FIG. 12B is another cross sectional view of the device along line B-B' to show parallel connection between the split trench capacitors.

Figure 13A:
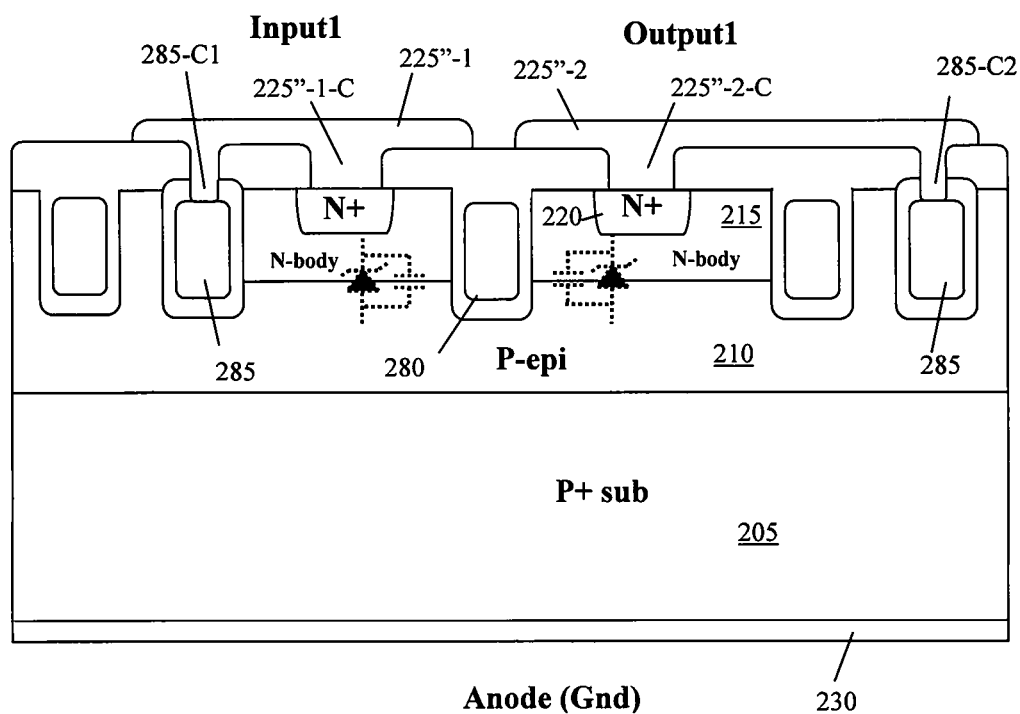
FIGS. 13A and 13B are respectively a side cross sectional view and a top view of a vertical TVS integrated with EMI filter manufactured by using a DMOS technology and configured as vertical diodes isolated by isolations trenches and interconnected with trenched inductor.
Figure 13:
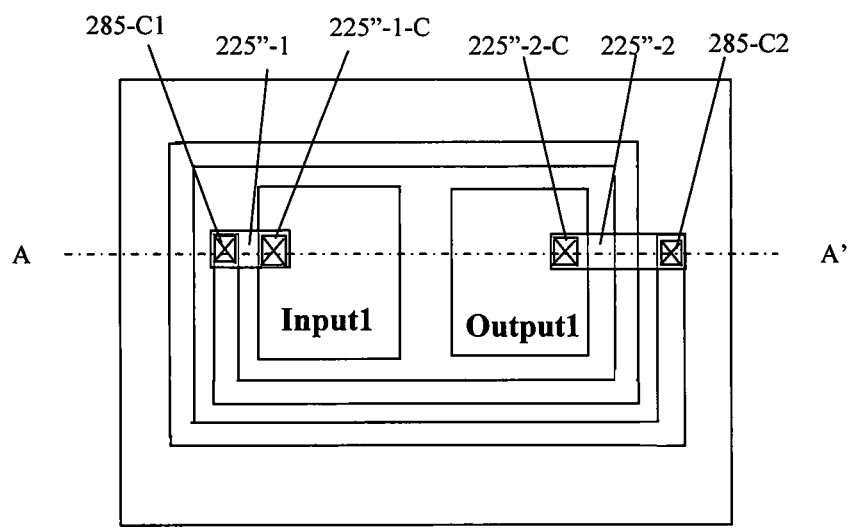

FIGS. 13 A and B are a side cross-sectional view and top view for showing the layout of using trench inductor in a device that includes a multi-channel TVS formed as a first and second diodes as that shown in FIG. 4 with a first cathode electrode 225"-1 functions as an input terminal and a second cathode electrode 225"-2 functions as an output terminal. The first and second diodes are isolated by an isolation trench 280 and connected by trenched inductor 285. The contact opening for the input and output terminal are shown as 225"-1-C and 225"-2-C respectively. The contact openings to the trenched inductors are shown as 285-C1 and 285-C2 respectively to the input and output electrodes respectively.

Figure 14A:
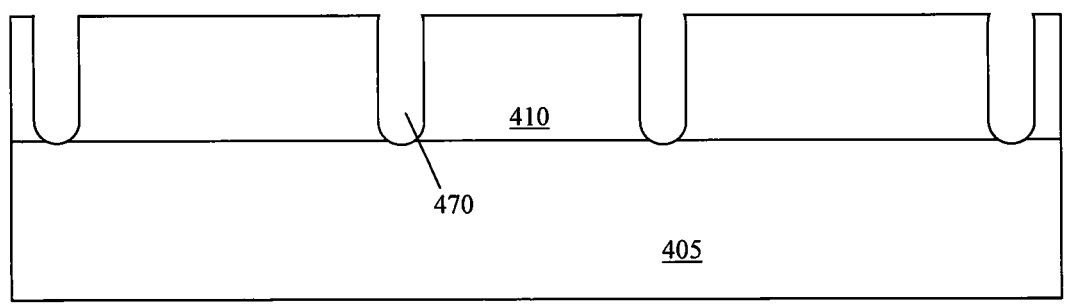
FIGS. 14A-14G are a series of cross sectional views for showing the manufacturing processing steps of a multi-channel VTVS integrated with EMI filter according to current invention using mainstream trench DMOS process
Figure 14B:
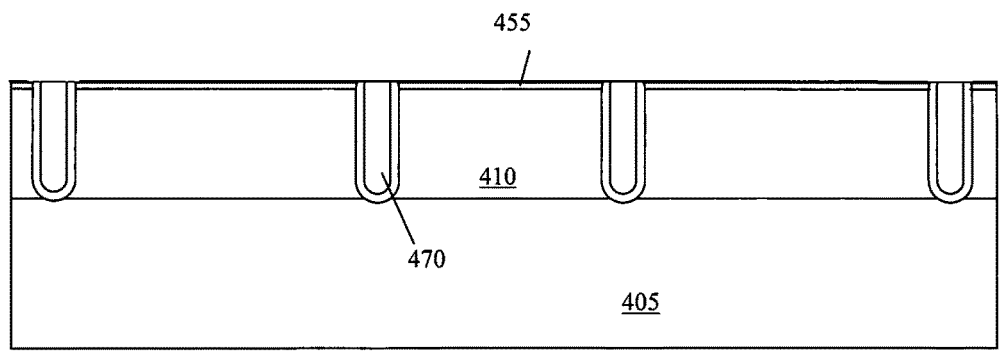
Figure 14C:
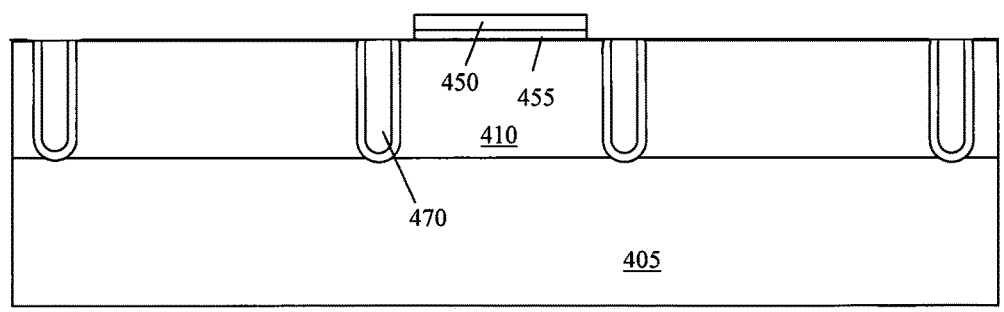
Figure 14D:
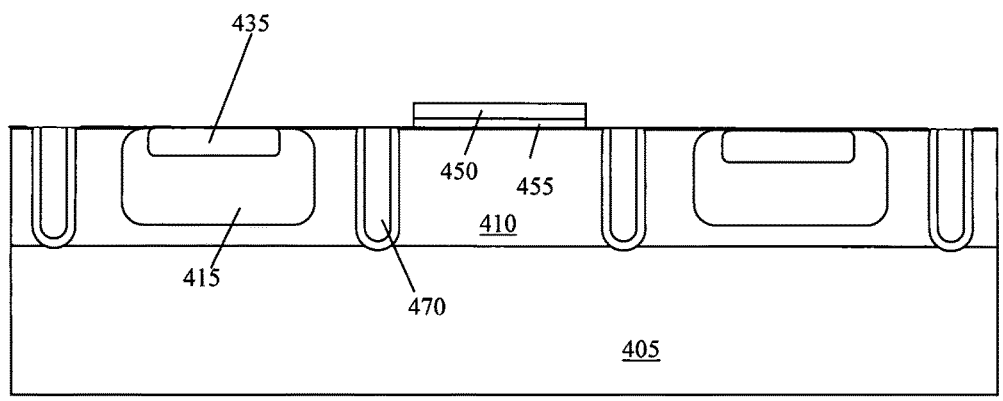
Figure 14E:
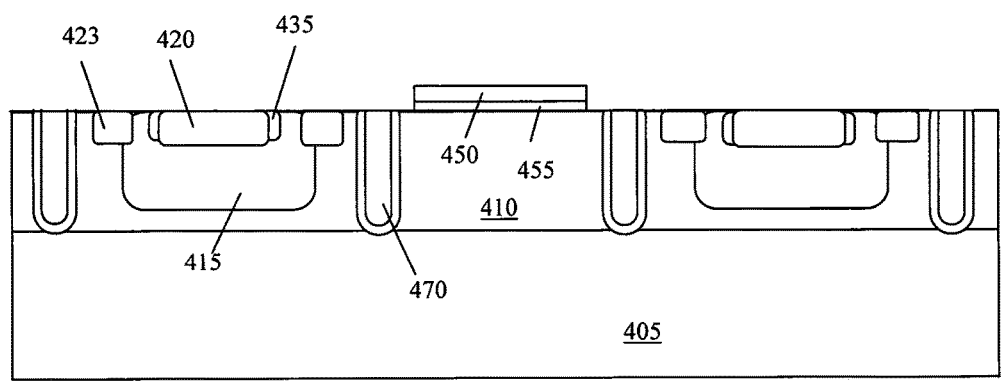
Figure 14F:
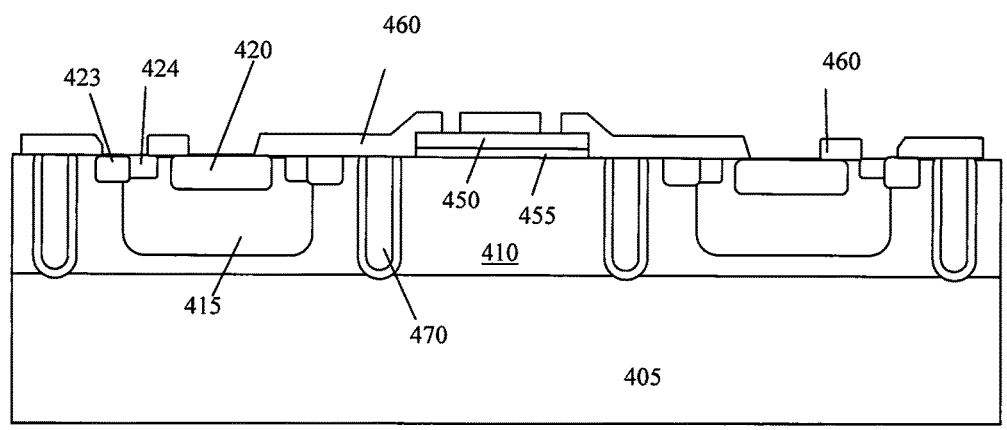
Figure 14G:
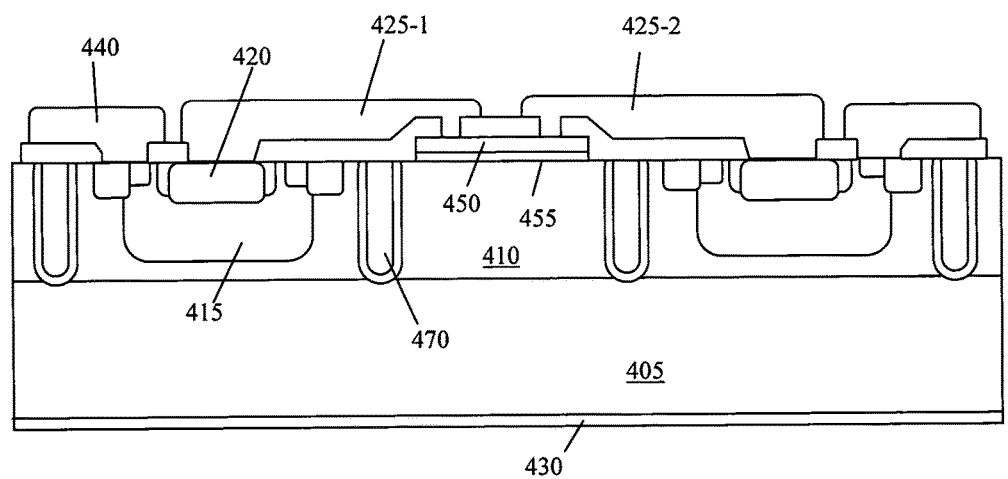

Refer to FIGS. 14A-14G for a manufacturing process of a multi-channel VTVS integrated with EMI filter according to current invention using mainstream trench DMOS process. In FIG. 14A, a plurality of trenches 470 is formed in a N Epitaxial layer 410 on top of a N+ substrate 405 by etching through an oxide hard mask (not shown). The substrate 405 is a heavily doped substrate as typical used for vertical DMOS device, with dopant concentration higher then 1E18/cm3, corresponding to a resistivity of less than 20 mili-ohm-cm for N type and 40 mili-ohm-cm for P type, compared to the typical IC process substrates that has a dopant concentration of less then 1E16 and a resistivity of several ohm-cm. Alternatively, a lightly doped substrate with a heavily doped bottom layer to reduce resistivity may be used. The trenches are preferably etched through the Epitaxial layer 410 to reach substrate 405 in order to provide best isolation. Optional processes may be implemented to remove the oxide hard mask, growing sacrificed oxide and rounding the trench bottom as provided in trench DMOS process. In FIG. 14B a gate oxide layer 455 is thermally grown then a poly is deposited to fill the trenches followed by a blanket etch back process to remove the extra poly over the trenches. The thickness of oxide layer 455 may be increase by thermal growing or deposition to a desired thickness. In FIG. 14C a second poly deposition is carry out with precise controlled thickness and doping density then patterned with a mask to form the second poly 450 to form EMI filter resistor. The oxide layer 455 is also cleared for the following implantation steps. In FIG. 14D, P body region 415 and initial breakdown adjustment region 435 are implanted and diffused by P type dopant. To obtain a deep P body region 415 high energy implant may be implemented. In one embodiment, Boron implantation is carried out at the energy level between 700 KeV to 1000 KeV with dose ranging from 5E13 to 1E14 to form a P body with 2-3 um depth. In FIG. 14E N type implantation is carried out to from N+ regions 420 and 423. In FIG. 14F an oxide layer 460 is formed on top of the surface followed by an optional BPSG deposition and flow to planarize the surface. A P+contact implant is carried out to form P-body contact region 424 after the contact opening are etched through the oxide layer 460. It should not counter doping the N+ region 423, which is provided for Epitaxial layer ohmic contact for shorting the P-body to the Epitaxial and substrate. In one embodiment the contact implant use B/BF2 with a dose of 2E15/cm2, at the energy 60 KeV, while the N+ regions are formed by double implant with an As dose at 4E15 with an implantation energy at 80 KeV followed with P dose at 4E15 energy at 80 KeV. The N+ region 420 counter dopes the central portion of breakdown controlling P region 435 which has been implanted with a lower dose of 1E13-4E13 at a lower energy of 50 KeV, leaving the edge of 435 region unaffected to form a lateral diode with N+ region 420 for initial breakdown. In FIG. 14D metal layer are deposited and patterned to form the input electrode 425-1 and output electrode 425-2, as well as P-body Epitaxial short electrode 440. Metal layer 430 is also deposited on the bottom surface to form Anode electrode.

The process described above provides a vertical TVS integrated with EMI filter configured as NPN transistors isolated by trenches and connected by a resistor element manufactured by using a DMOS technology similar to the embodiment as disclosed in FIG. 9C with the initial breakdown diode placed laterally. Other embodiments may be made starting with proper substrates by similar process by modifications of adding or skipping certain steps. Specifically embodiments without the isolation trenches may skip the trench formation process; embodiments of VTS without integrated EMI filter may skip the second poly deposition process. Further, the embodiment with split gate for increasing capacitance as shown in FIGS. 13A and 13B may include multiple steps of gate poly deposition and etch back process.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A vertical transient voltage suppressing (VTVS) device supported on a bottom semiconductor layer of a first conductivity type comprising:
    an epitaxial layer of the first conductivity type disposed on top of the bottom semiconductor layer substrate;
    a plurality of trenches opened in the epitaxial layer each padded with a gate dielectric layer and filled with a conductive gate material;
    a body of a second conductivity type disposed in the epitaxial layer extended between two adjacent trenches encompassing source regions of the first conductivity type disposed near a top surface of the body region and next to the trenches on two opposite sides of the body region; and
    one of the trenches disposed on an edge of the epitaxial layer is a gate runner wherein the gate runner is covered with a top gate metal and the top gate metal is electrically shortened to the bottom semiconductor layer functioning as a drain.

2. The VTVS device of claim 1 wherein:
    the bottom semiconductor layer of the first conductivity type is a heavily doped layer having a dopant concentration higher than 1E18/cm3.

3. The VTVS device of claim 1 wherein:
    the body region of the second conductivity type interfacing with the epitaxial layer of the first conductivity type to form a PN junction to function as an inherent diode for the VTVS device.

4. The VTVS device of claim 1 further comprising:
    the source region of the first conductivity type disposed near the top surface combined with the boy region of the second conductivity and the epitaxial layer of the first conductivity type to form a bipolar transistor for the VTVS device.

5. The VTVS device of claim 1 wherein:
    the epitaxial layer of the first conductivity type is an N type epitaxial layer and the body region of the second conductivity type is P-type body region encompassing the source regions as N-type source regions disposed near the top surface of the P-type body region.

6. The VTVS device of claim 1 further comprising:
    a top insulation layer covering over the top surface of the epitaxial layer wherein the top insulation layer further having contact a gate contact opening and a source contact opening; and
    a metal layer covering over the top insulation layer wherein the metal layer is patterned into the top gate metal and a source metal wherein the top gate metal contacts the gate runner through the gate contact opening and the source metal contacts the top surface of the body region and the source region through the source contact opening.

7. The VTVS device of claim 6 wherein:
the body region of the second conductivity further having a source metal contact dopant region of the second conductivity type disposed between the source regions near the top surface of the body region for contacting the source metal.

8. The VTVS device of claim 1 wherein:
the gate runner disposed on the edge of the epitaxial layer having a greater width than the trenches disposed next to the body region and source regions.

9. The VTVS device of claim 1 wherein:
the bottom semiconductor layer has a higher dopant concentration than the epitaxial layer of the first conductivity type.

10. The VTVS device of claim 1 further comprising:
a backside terminal comprises a metal layer disposed under the bottom semiconductor layer further.

* * * * *